United States Patent [19]

Mahawili

[11] Patent Number: 4,834,022
[45] Date of Patent: May 30, 1989

[54] CVD REACTOR AND GAS INJECTION SYSTEM

[75] Inventor: Imad Mahawili, Sunnyvale, Calif.

[73] Assignee: Focus Semiconductor Systems, Inc., Sunnyvale, Calif.

[21] Appl. No.: 114,326

[22] Filed: Oct. 27, 1987

Related U.S. Application Data

[63] Continuation of Ser. No. 796,675, Nov. 8, 1985, abandoned.

[51] Int. Cl.$^4$ ............................................. C23C 16/00
[52] U.S. Cl. ................................... 118/725; 118/715; 118/728; 118/730
[58] Field of Search ............... 118/715, 723, 724, 725, 118/728, 730

[56] References Cited

U.S. PATENT DOCUMENTS

| | | | |
|---|---|---|---|
| 3,633,537 | 1/1972 | Howe | 118/500 |
| 3,696,779 | 10/1972 | Murai | 118/730 |
| 3,750,620 | 7/1973 | Eversteijn | 118/715 |
| 3,757,733 | 9/1973 | Reinberg | 118/715 |
| 3,783,822 | 1/1974 | Wolam | 118/730 |
| 3,922,467 | 11/1975 | Pinchon | 118/500 |
| 4,058,430 | 11/1977 | Suntola | 118/730 |
| 4,142,004 | 2/1979 | Hauser | 118/730 |
| 4,282,267 | 8/1981 | Kuyel | 427/94 |
| 4,596,208 | 6/1986 | Wolfsn | 118/730 |
| 4,599,135 | 6/1986 | Tsunekawa | 118/730 |

*Primary Examiner*—Richard Bueker
*Attorney, Agent, or Firm*—Skjerven, Morrill, MacPherson, Franklin & Friel

[57] ABSTRACT

A CVD reactor has a unique geometry to control the thickness of a film formed on the surface of a substrate. The reactor is approximately cylindrical in shape. The base of the reactor is inclined at an angle of approximately 3°–5° from the vertical and has a central platform with a recessed well. The substrate is placed in the well so that the surface of the substrate on which the film is deposited does not protrude above the platform surface. The reactant gases are mixed in a region adjacent the cylindrical wall of the reactor and flow radially inward across the wafer surface. The thickness of the deposited film is controlled by contouring a plate positioned opposite the wafer surface so that the distance between the wafer surface and the plate, and hence the deposition rate, is controlled.

18 Claims, 5 Drawing Sheets

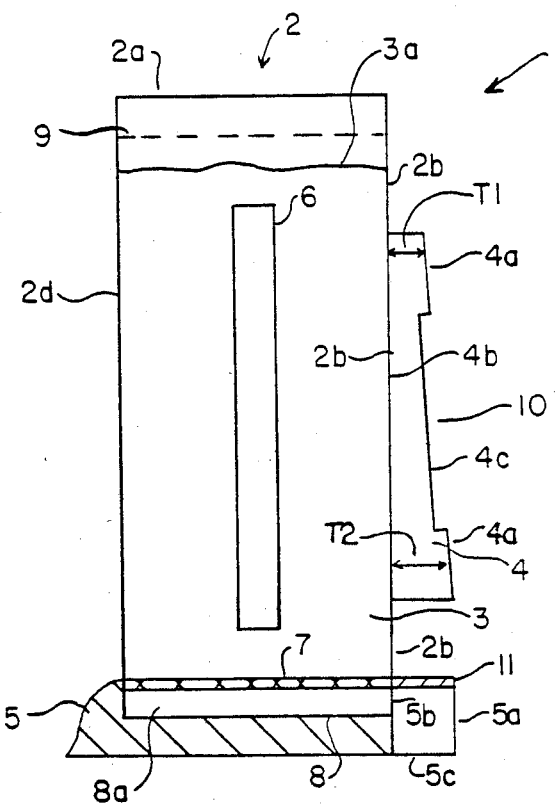
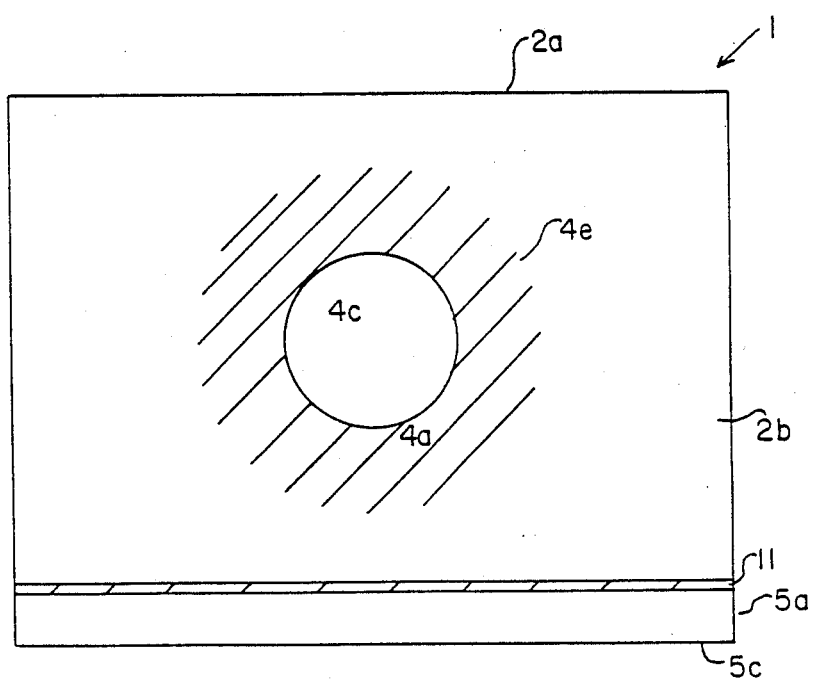
FIG. 2
FIG. 3

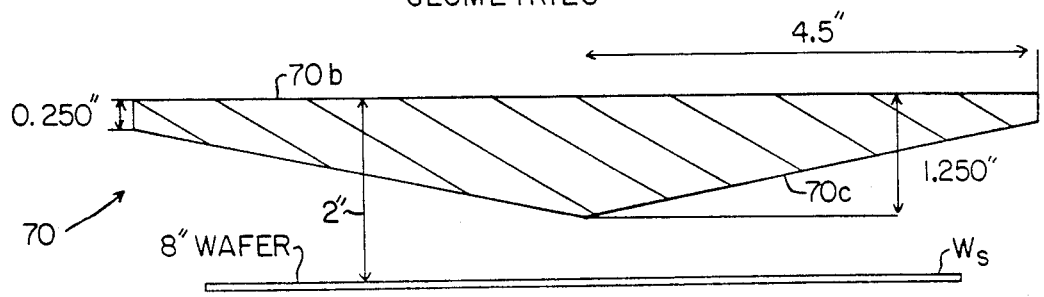
FIG. 7a 8" WAFER Z-PLATE
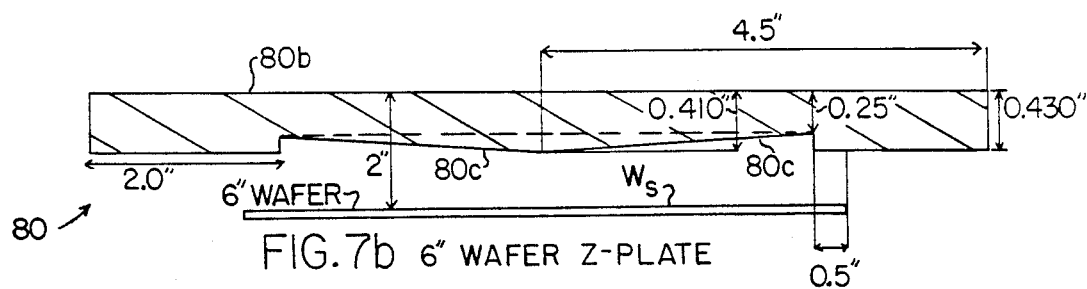
FIG. 7b 6" WAFER Z-PLATE
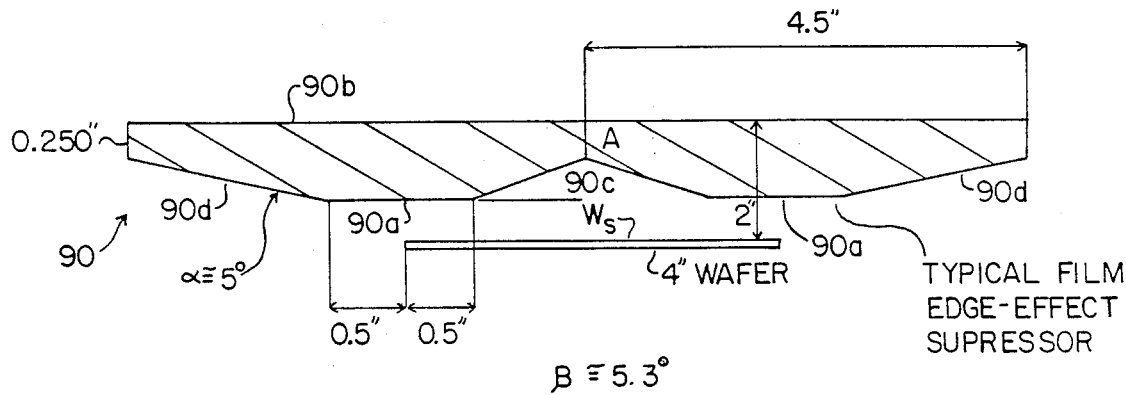
FIG. 7c 4" WAFER Z-PLATE

CVD REACTOR AND GAS INJECTION SYSTEM

This application is a continuation of application Ser. No. 796,675 filed Nov. 8, 1985, now abandoned.

FIELD OF THE INVENTION

This invention relates to a device for performing chemical vapor deposition (CVD) on a substrate and in particular to a CVD reactor and gas injector system for achieving deposition of films having uniform thickness on a semiconductor wafer.

BACKGROUND

Chemical vapor deposition reactors for processing semiconductor wafers are well known in the art. For example, Yamazaki, et al., U.S. Pat. No. 4,105,810, issued Aug. 8, 1978 which is incorporated herein by reference shows in FIGS. 3a, 3b and 3c three configurations of reactors and nozzles for performing chemical vapor deposition on a semiconductor substrate. None of these reactors or nozzle designs completely solves the problem of depositing a CVD coating on a wafer so that the wafer has a uniform thickness. In fact, the problem of achieving a coating of uniform thickness over the entire surface of a wafer has become more acute and more difficult as semiconductor wafers have increased in size (diameter). In turn, the proposed solutions to the problem have become more complex. For example, with a view to improving uniformity, Yamazaki et al. supra states that it is preferred to impart a rotational or reciprocating movement to the nozzle within the reaction chamber or to the substrate (see column 6, lines 17-19). However, in addition to introducing problems of reliability, such moving parts themselves tend to introduce undesirable particulate contamination without in fact solving the problem of uniform deposition.

SUMMARY OF THE INVENTION

A CVD reactor having a unique geometry is disclosed which enables chemical vapor deposited film having a controlled thickness to be formed on the surface of a substrate. The reactor chamber is approximately cylindrical in shape. A substrate, typically a semiconductor wafer, is positioned on a heater platform which forms a portion of the base of the approximately cylindrical reactor chamber. In one preferred embodiment the base of the reactor chamber is circular and the surface of the base on which the wafer is placed is inclined at an angle of approximately 3°–5° from the vertical (i.e. the direction of the earth's gravity vector). In this embodiment, the heater platform has a slightly recessed circular well for holding the semiconductor wafer.

The slight incline enables the force of gravity to hold the semiconductor wafer in the well while the wafer surface remains approximately vertical (i.e. within 3°–5° of vertical) and, more importantly, the recessed well reduces the edge effects that would be caused by positioning a wafer on a heater platform having a flat surface wherein the raised edge of the wafer interferes with the gas flow across the wafer surface.

The gas injector system for the reactor includes means for introducing one or more gases into the reactor chamber. Each gas enters the reaction chamber from a corresponding gas line and flows into a recessed annular chamber corresponding to that gas line, the recessed annular chamber being located in the top portion of the reactor structure opposite the base of the reactor. Each gas becomes uniformly distributed in its annular chamber and then enters the reactor chamber through a plurality of small orifices that are preferably uniformly distributed along the surface of the annular chamber. Each gas is deflected outward toward a circular wall connecting the base and the top of the reactor chamber by a corresponding annular deflection plate appropriately positioned with respect to the corresponding plurality of orifices. The injected gases thus become uniformly mixed in the peripheral region of the reactor chamber adjacent the circular wall and the gaseous mixture then flows radially inward toward the central region of the reactor.

The reacted gases exit the reactor chamber via an annular vent surrounding the heater platform, passing into a vent chamber laterally surrounding the heater platform. This vent chamber is connected to a vacuum pump.

Of importance, the rate of deposition of the film at each point on the wafer is controlled geometrically by appropriately configuring the inner top surface of the reactor chamber. In one embodiment this is done by using what is called a "Z plate." The Z plate is a plate that specifies the distance between each point on the surface of the heater platform (and hence the wafer) and the corresponding point directly opposite it on the Z plate. In general, by appropriately configuring the Z plate, a film having a desired thickness profile is produced on the substrate. In one embodiment, by appropriately configuring the Z plate, the edge effects, which still exist despite the recessed well for holding the wafer, are suppressed and a CVD coating having a controlled thickness in each region of the wafer is produced. Typically the Z plate is configured in order to produce a CVD coating having a uniform thickness over the entire surface of the wafer. The preferred shape of the Z plate for producing a uniform thickness depends on the diameter of the wafer and the diameter of the cylindrical reactor chamber. Using this geometric control technique, wafers having a chemical vapor deposited film having a uniform thickness of T±1%T have been repeatably produced. For many reactions the uniformity is T±0.7%T. If desired, the Z plate may be configured to produce films having other depth profiles, for example, films which are relatively thicker near the center of the wafer or alternatively, films which are relatively thicker near the edge of the wafer. However, typically the Z plate is designed in order to produce a highly uniform film over the entire surface of the wafer.

BRIEF DESCRIPTION OF THE DRAWINGS

FIG. 2 shows a partial cross section of one embodiment of the fluidized bed heater shown in FIG. 1;

FIG. 3 shows a front view of the wafer platform mounted on the front surface of the heater shown in FIG. 2;

FIGS. 7a, 7b and 7c show three typical Z plate geometries in cross-section.

DETAILED DESCRIPTION

Figure 1:
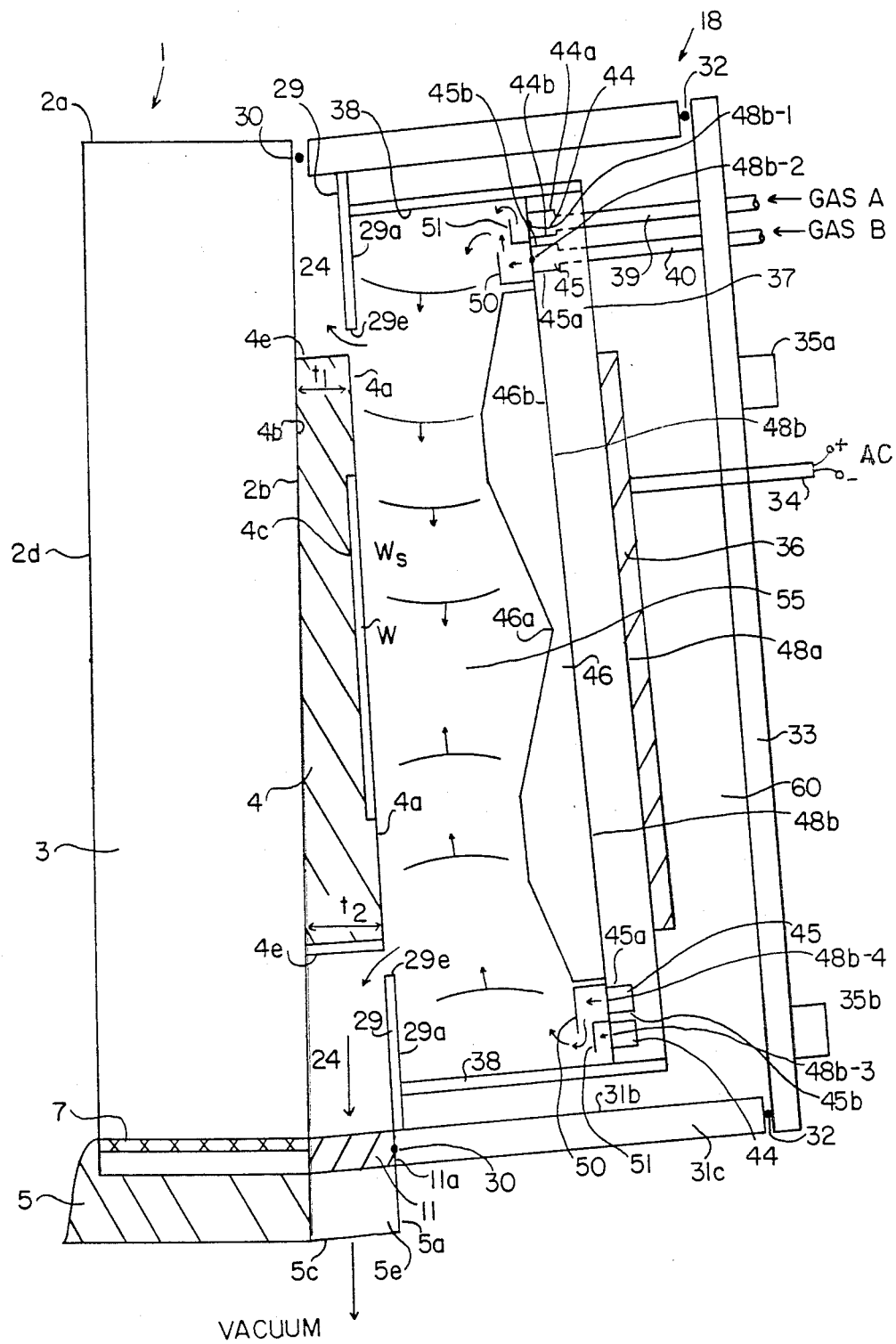
FIG. 1 shows a cross section of one embodiment of the gas injection and CVD reactor system of the present invention.

FIG. 1 shows a cross section of one preferred embodiment of the gas injection and CVD reactor system of the present invention. The system includes a heater section 1 and a gas distribution section 18 which together form reactor chamber 55 when joined together by elastomeric O-ring 30.

In a preferred embodiment, heater section 1 comprises a fluidized bed heater which is more fully described in copending U.S. patent application No. 6/707,262, filed Mar. 3, 1985 on an invention of Dr. Imad Mahawili, the inventor of the gas injection and CVD reactor system of the present invention. The '262 application is incorporated herein by reference. Other heaters known in the art, for example resistive heaters, radiant heaters or radio frequency coupled heaters may be used with the present invention. But the preferred heater is described below.

FIG. 2 shows a partial cross section of one preferred embodiment of fluidized bed heater 1. Heater mantle 2 comprising top surface 2a, planar front surface 2b and planar rear surface 2d has a generally rectangular crosssectional shape. Mantle 2 is rigidly attached to bottom support plate 8 in base 5. Heater mantle 2 may be made out of a variety of materials, for example, metal, silicon, quartz, or graphite. Back surface 4b of wafer holding platform 4 is attached to the front rectangular surface 2b of housing 2. Platform 4 is a circular platform having a thickness $T_1$ at the top of the platform as indicated by arrow $T_1$ in FIG. 2 and having a thickness $T_2$ greater than $T_1$ at the bottom of the platform as indicated by arrow $T_2$ in FIG. 2. As shown in FIG. 2 and FIG. 3, circular front surface 4a of platform 4 has a uniformly recessed circular well 10 concentric with the circumference of platform 4 for holding semiconductor wafer W.

FIG. 3 shows a front view of wafer platform 4 mounted on front rectangular surface 2b of heater 1. Surface 4c is recessed relative to surface 4a. Semiconductor wafer (substrate) W is positioned in well 10 of heater platform 4 as shown in FIG. 1. The depth of well 10 is about 0.010 inches greater than the nominal thickness of wafer W so that front surface $W_S$ of wafer W does not protrude above surface 4a even for those wafers whose thickness exceeds nominal thickness by 0.010 inches. The diameter of well 10 is designed to be approximately 0.02 inches greater than the diameter of wafer W.

Figure 4:
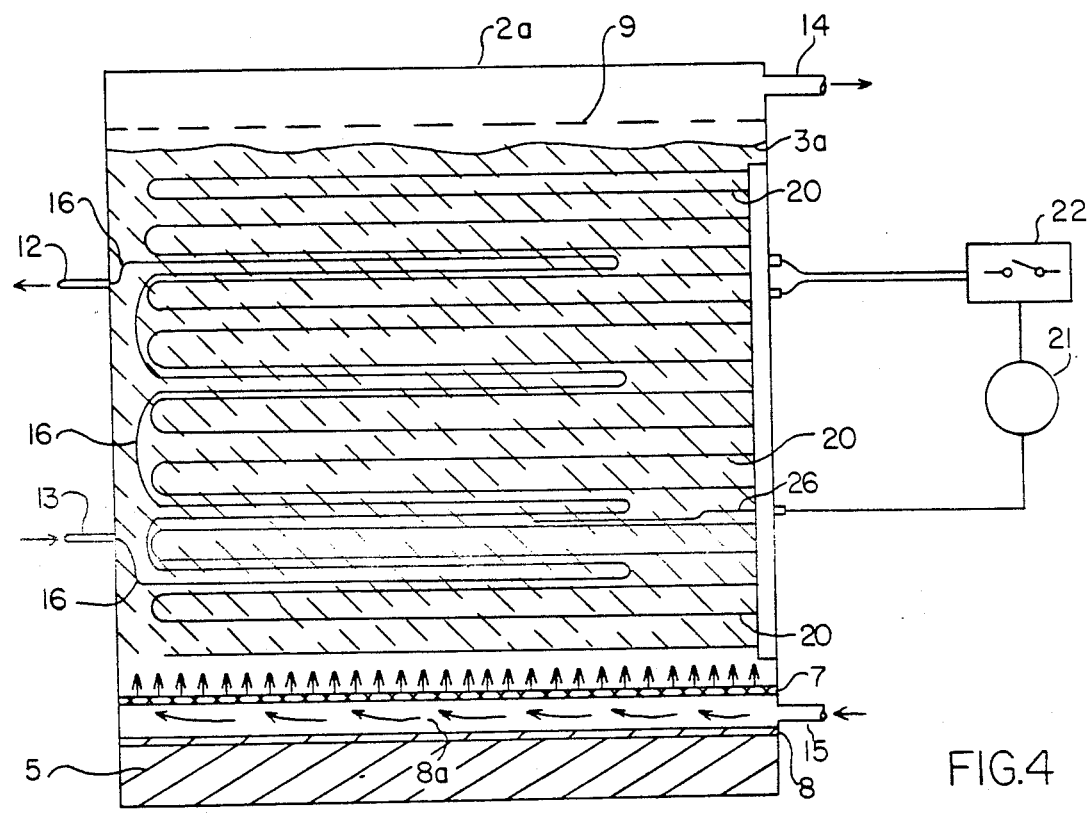
FIG. 4 shows a front view cross section of the heater shown in side view cross section in FIGS. 1 and 2.

As shown in FIGS. 2 and 4, fluidizing gas, typically an inert gas such as nitrogen, is introduced under pressure into a plenum chamber 8a between bottom support plate 8 and distribution plate (diffuser) 7. The gas supply may be connected to chamber 8a via base 5 or through a suitable opening (not shown in FIG. 2) in mantle 2 between support plate 8 and diffuser 7. The particles which constitute bed 3 rest upon distribution plate 7. These particles may be made of a wide variety of materials having a wide range of particle size distribution, for example, metal powders, ceramic balls, or sand. In one embodiment of the heater 40–80 mesh particles of alumina are employed. In another embodiment, 10–200 mesh sand particles are employed though even larger particles may be used.

Mesh screen 9 is located above surface 3a of bed 3 and serves to prevent bed particles from escaping the bed. The mesh of screen 9 is typically smaller than the mean particle size. The pressurized gas passes upward through bed 3, fluidizing the bed, and then through mesh screen 9. The pressurized gas exits the heater by means of an opening 14 (not shown in FIG. 2 in mantle 2 located above mesh screen 9. Rectangle 6 in FIG. 2 shows schematically the relative location of heating and cooling elements in bed 3. These heating and cooling elements are shown in more detail in FIG. 4. Grating 11 and plates 5a, 5b and 5c shown in FIG. 2 form a rectangular chamber which is connected to a vacuum pump which evacuates gaseous products formed in chamber 55 (FIG. 1).

FIG. 4 shows a front view cross section of the heater shown in side view cross section in FIGS. 1 and 2. In FIG. 4 the fluidizing gas enters chamber 8a through opening 15 in mantle 2 located between bottom support 8 and distribution plate 7. The fluidized gas exits the heater through opening 14 in mantle 2 located above mesh screen 9. The heating and cooling elements shown in FIG. 4 are located in region 6 shown in FIG. 2. The cooling elements include tube 16 through which a liquid e.g. water is circulated when the bed is being cooled. The water enters through opening 13 in mantle 2 and exits through opening 12 in mantle 2 after flowing through tubular loops indicated schematically by line 16 in FIG. 4.

FIG. 4 also shows the distribution of wire heating element 20 in region 6. Thermocouple 26 senses the temperature of fluidized bed 3 and provides a signal representing the temperature to controller 21 which controls power switch 22. When the temperature sensed by thermocouple 26 reaches a selected temperature $T'_1$ controller 21 causes switch 22 to stop supplying current to heating wire 20. When the temperature of fluidized bed 3 falls below the selected temperature, current is again supplied to heating wire 20. It is important to note that the selected temperature $T'_1$ to which the fluidized bed is heated is generally higher than the selected temperature $T_1$ to which it is desired to heat wafer W resting on surface 4a. This higher temperature is needed in order to allow for the thermal gradient across heater mantle 2 and across platform 4 and to allow for heat losses. Employing this fluidized bed heater and the above described thermal couple, the temperature of the wafer resting in well 10 is maintained at a selected temperature $T_1 \pm 1°$ C. This temperature is uniform over the entire surface of the wafer. Cooling tube 16 has sufficient capacity to rapidly cool bed 9 to a second selected temperature $T_{2'}$ which corresponds to a second selected temperature $T_2$ for wafer W. Once the selected temperature is achieved, it is maintained by controller 21, switch 22 and thermal couple 26. The cooling liquid enters cooling tube 16 via opening 13 and exits the fluidized bed via opening 12.

Figure 5:
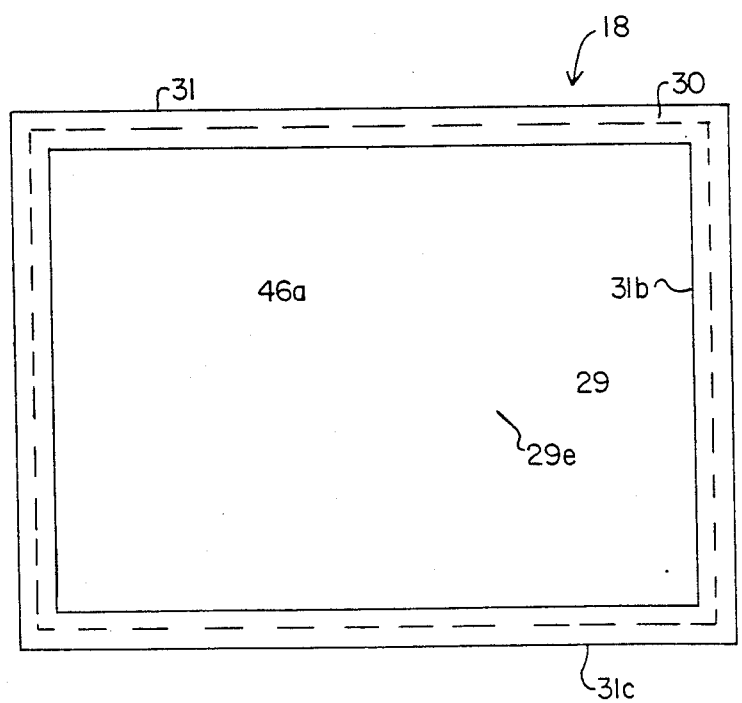
FIG. 5 shows a view of the injector section of FIG. 1 as viewed from the heater section of FIG. 1.

Heater section 1 described above with reference to FIGS. 1, 2, 3 and 4 is designed to mate with the gas injector section 18 shown in FIGS. 1 and 5 thereby forming reactor chamber 55. FIG. 1 shows a cross section of gas injector section 18 and FIG. 5 shows section 18 as viewed from heater section 1. Housing 31 is a rectangular housing which is joined by elastomeric O-ring 30 to the rectangular perimeter of surface 2b of heater 1 shown in FIG. 3 except that lower portion 31c of housing 31 shown in FIG. 5 is joined to edge 11a of grating 11 shown in FIG. 1 and FIG. 3. Housing 31 may be made of various materials, for example, stainless steel. Top plate 33 is a rectangular plate which is joined to rectangular housing 31 by elastomeric O-ring 32.

An inner, approximately cylindrical, reactor chamber 55 is formed within housing 31 as follows: rectangular plate 29 extends inwardly from the walls of housing 31 as shown in FIGS. 1 and 5. Plate 29 has a central circular section removed which has a larger diameter than the diameter of platform 4 so that an annular opening is created between edge 29e and platform edge 4e when gas injector section 18 is joined to heater section 1. Housing 31, front heater face 2b, plate 29 and grating 11 together form an exhaust chamber which laterally surrounds heater platform 4. Exhaust chamber 24 communicates with a vacuum pump (not shown) via grating 11. An inner cylindrical housing 38, which in one embodiment is fabricated of aluminum (other metals such as stainless steel or insulating materials may also be employed, the choice depending on the reactant gases and the temperature at which the reaction is carried out), is joined to plate 29 as shown in FIG. 1. This may be accomplished by welding or by machining plate 29 and housing 38 as one piece. Circular top plate 37 is joined to cylindrical housing 38 either by welding or by machining housing 38 and top plate 37 as one piece. Thus an approximately cylindrical reactor chamber 55 is defined by cylindrical housing 38, circular top plate 37, plate 29 and platform 4. Surfaces 29a, 4a and 4c form the circular base of the cylinder, which is inclined at an angle of 3°-5° from the vertical.

Reactant gases A and B enter reactor chamber 55 via gas lines 39 and 40. Each gas line is selected to be large enough so that gas is communicated with essentially no resistance. Typically, gas lines 39 and 40 have a diameter of one quarter inch. Gas line 39 and gas line 40 each pass through a suitable opening in circular plate 33. Gas line 39 and gas line 40 communicate with annular chambers 44 and 45, respectively, which are recessed into top plate 37 of reactor chamber 55. The width of each recessed chamber (the distance between chamber edge 44a and 44b and the distance between chamber edge 45a and 45b) should be at least one half inch and the depth of each chamber should be at least one half inch. A first reactant gas A is uniformly distributed in annular chamber 44 and a second reactant gas B is uniformly distributed in annular chamber 45.

Figure 6:
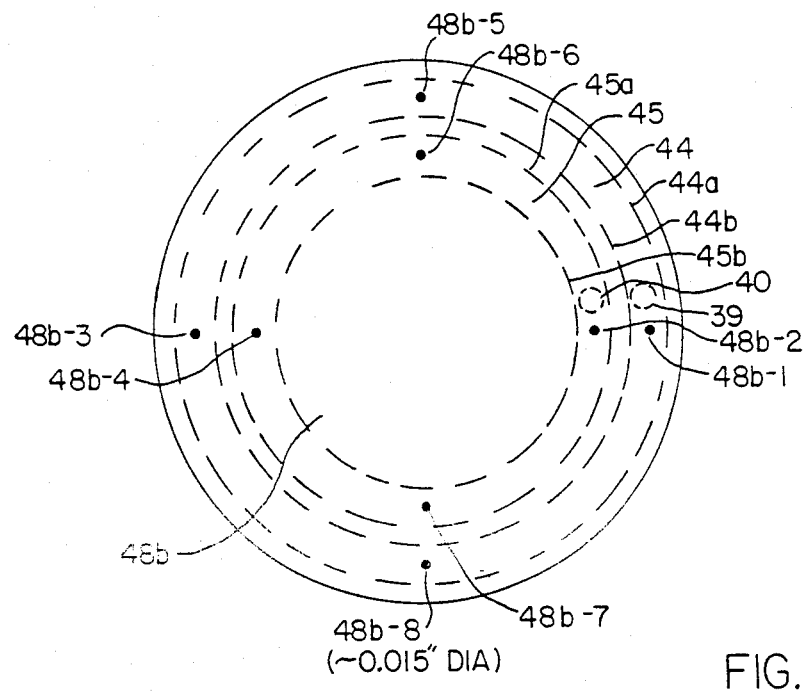
FIG. 6 shows the gas injector plate and gas jets therein.

As shown in FIGS. 1 and 6, gas is communicated from annular chamber 44 to reactor chamber 55 via orifices (jets) 48b-1, 48b-3, 48b-5, and 48b-7, which are uniformly spaced (90° apart) around injector plate 48b which forms one side of annular chamber 44. If desired, a larger number of jets can be employed. Similarly, gas is communicated from annular chamber 45 to reactor chamber 55 via orifices (jets) 48b'-2, 48b-4, 48b-6, and 48b-8 which are uniformly spaced around injector plate 48b which also forms one surface of annular chamber 45. The jets described above typically have a selected diameter between 0.010 and 0.015 inches depending on gas composition and flow rate. Injector plate 48b is attached to the inner surface of top plate 37.

L-shaped annular deflector plates 50 and 51 extend from injector plate 48b so that gas emerging from jets 48b-1, 48b-3, 48b-5 and 48b-7 strikes deflector plate 51 and is deflected radially outward to cylindrical wall 38. Similarly, gas emerging from jets 48b-2, 48b-4, 48b-6 and 48b-8 strikes deflector plate 50 and is deflected outward toward cylindrical wall 38. This separate deflection design is novel in reducing jet velocities of each gas stream prior to mixing of the gases. This prevents the reaction of gas A and gas B due to high velocity impingement of gas A with gas B during injection. The reactant gases A and B become uniformly mixed in the peripheral region of the reactor chamber adjacent circular cylindrical housing 38 and then flow radially inward as in a dynamically converging toroid toward the central region of the cylindrical chamber.

I have deduced that as long as the flow is laminar, the Navier-Stokes equation suggests that the motion of the gaseous mixture directed radially inward from inner housing 38 can best be described by the parabolic velocity profiles depicted in FIG. 1. These velocity profiles form very near the outer circumference of chamber 55 and proceed across the entire circular perimeter of the wafer and across the surface of the wafer toward the central region of the chamber as in a dynamically converging toroid. The gas molecules moving toward the central region from all radial directions create a slightly higher pressure zone in the center of chamber 55, which subsequently drives gas molecules out of chamber 55 by concentration displacement through the annular opening formed between edge 29e of plate 29 and edge 4e of platform 4 into exhause chamber 24 which is connected to a vacuum pump (not shown) via grating 11 which connects exhaust chamber 24 to vacuum exhaust chamber 5e formed by grating 11, base 5, rectangular plate 5a and plate 5c which has openings (not shown) for connecting to a vacuum pump.

For certain reactions it is desirable to maintain the surface temperature of the inner housing 38 and plate 48b at only a moderately lower level than heating platform 4. In this case, insulating material is placed in cavity 60 formed by outer housing 31, inner housing 38, the outer portion of plate 29, top plate 33 and plate 37. Cavity 60 may also be filled with liquid, e.g. chilled water, which enters cavity 60 via port 35a and is recirculated to an external chiller (not shown) via port 35b. For still other reactions it is desirable to maintain plate 37 at a specific temperature higher than than which is achievable using only insulation. For these reactions a separate heater 36 is affixed to plate 37 and current supplied via conduit 34 through top plate 33.

The gas injector system described above was implemented in practice to grow a silicon dioxide film on a silicon wafer. Gas A was silane and gas B was oxygen. Wafer W was maintained by heater 1 at a temperature of 400° C. Pressure in reactor chamber 55 was maintained at a selected pressure between 100 and 400 millitorr. Under these conditions it was found that for the eight inch wafers the depth of the film grown on wafer surface $W_S$ increased monotonically from the edge of the wafer to the center of the wafer. This corresponds to the slightly higher pressure zone near the center of chamber 55 as described above. The above described nonuniformity was eliminated by attaching Z plate 46 to the center portion of injector plate 48b above wafer platform 4. For the gas flow pattern and cylindrical chamber 55 described above, I have deduced from localized molecular collision frequency theory that relates the surface chemical reactivity to localized volume and pressure that the most important variable in controlling the local rate of chemical reaction at the surface of the wafer is the local volume distribution of the reaction chamber above the wafer. In accordance with this invention, this variable is controlled by controlling the distance between heater platform surfaces 4a and 4c and surface 46a of Z plate 46 by appropriately shaping the Z plate. In general, locally decreasing the distance between the surface of the wafer and the surface of the Z plate locally decreases the rate of film deposition from what it would otherwise be, since decreasing the distance decreases the local probability of molecular collision. Similarly, locally increasing this distance locally increases the deposition rate. FIGS. 7a, 7b and 7c show a cross section of typical Z plate geometries for achieving a uniform deposition profile on wafers of varying diameters. The Z plates shown in FIGS. 7a, 7b and 7c were used with a reactor wherein the diameter of inner housing 38 was 13 inches. The shape of these plates was determined emperically. The wafers shown in FIG. 7a through 7c are located in well 10 of heater platform 4 (which is not shown for simplicity). Z plate 80, shown in FIG. 7b provides excellent uniformity of deposition thickness on surface $W_S$ of wafer W having a six inch diameter (the thickness, t, of the deposition does not vary by more than 1% over the entire surface of the wafer). Z plate 80, shown in FIG. 7b, is a circular plate having a diameter of 4.5 inches. Surface 80b is attached to surface 48b of injector plate 37. The thickness of the annular region between surface 80b and annular surface 48a is 0.043 inches. The width of annular surface 80a is 2.0 inches. Annular surface 80a overlaps the wafer by 0.5 inches. The distance between back surface 80b and wafer surface $W_S$ is two inches. The reduced distance between surface 80a and the wafer surface $W_S$ (compared to the distance between wafer surface $W_S$ and surface 80c of Z plate 80b) suppresses the edge effects that would otherwise cause thicker deposition near the outer edge of the wafer. The remaining surface 80c is a shallow, right circular conical surface. As shown in FIG. 7b, the apex of this conical surface is 0.410 inches from surface 80b and is located opposite the center of wafer W. The base of conical surface 80c, indicated by the dashed line in FIG. 80c, is 0.25 inches from surface 80b. The decreasing distance between wafer surface $W_S$ and surface 80c as one progresses from the base of the cone to the apex of the cone causes the deposition on wafer surface $W_S$ to have uniform thickness. The shorter distance between wafer surface $W_S$ and surface 80c near the center of the conical surface 80c suppresses the deposition build up near the center of the wafer which would occur if surface 80c were flat.

FIG. 7a shows a configuration of Z plate 70 which is suitable for producing uniform deposition thickness on a wafer having an eight inch diameter. Back surface 70b of Z plate 70 is attached to injector plate 48b shown in FIGS. 1 and 6. Again, Z plate 70 is a circular plate having a diameter of 4.5 inches. Plate 70 is 0.25 inches thick at the edge and becomes thicker as it tapers downward toward the center of wafer surface $W_S$. The apex of the cone formed by surface 70c is 0.75 inches from the center of the wafer. The decreasing distance between right circular conical surface 70c and wafer surface $W_S$ as one progresses from the edge of the wafer to the center of the wafer produces a film having uniform thickness on the surface of the wafer. For the eight inch wafer, an edge suppressor region corresponding to annular region 80a in FIG. 7b is not necessary as the edge effects are not as pronounced when the edge of the wafer is near the perimeter of reactor chamber 55.

FIG. 7c shows a configuration of the Z plate in chamber 55 which is appropriate for producing a deposition having uniform thickness on the surface of the wafer having a four inch diameter. Surface 90b of plate 90 is attached to injector plate 48b. Z plate 90 has a radius of 4.5 inches and a thickness of 0.25 inches at its outer edge. Surface 90d tapers downward to the outer edge of annular surface 90a forming an angle alpha ($\alpha$) of approximately 5° with surface 90a. Note that the apex A of this conical surface 90c is further from the wafer than the base on conical surface 90c. Annular surface 90a is one inch wide and overlaps the four inch wafer by one half inch. Conical surface 90c forms an angle beta ($\beta$) of approximately 5.3° with annular surface 90a. The purpose of the short distance between annular surface 90a and wafer surface $W_S$ is again to suppress edge effects. For this wafer of smaller diameter, the edge suppressor surface 90a and conical surface 90c provide a Z plate geometry that produces a uniform deposition thickness on the surface of the wafer. As can be seen by the above examples, the Z plate can be configured to achieve a uniform deposition thickness profile over the entire surface of the wafer, the configuration depending on the diameter of the wafer.

As stated above, the shape fo the Z plates used to obtain a uniform deposition was determined empirically for silane and oxygen at 400° C. at a pressure between 100 and 400 millitorr. In general the configuration of the Z plate required to produce a uniform film thickness is a function of the pressure regime and of the particular chemical reaction employed. The reactor described above functions at a selected pressure between 0 torr and several hundred atmospheres and at desired temperatures consistent with the materials used to construct the housing. However the appropriate shape of the Z plate required to obtain a uniform film thickness must be determined empirically for pressure regimes other than those described herein.

Figure 8:
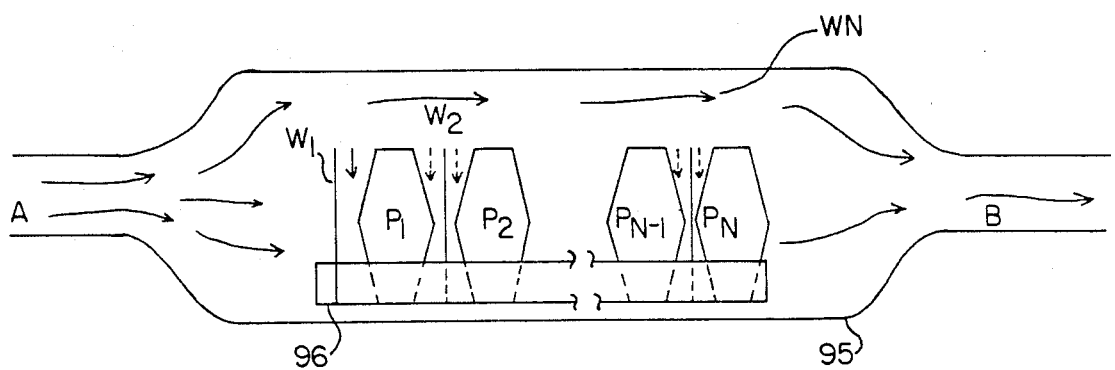
FIG. 8 shows an embodiment of the invention for a diffusion tube.

A Z plate of the present invention may also be used to control the depth profile of a film deposited on the surface of the wafer in the diffusion tube. FIG. 8 shows a cross section of one embodiment of the present invention for a diffusion tube. One or more reactant gases enter diffusion tube 95 at end A from a gas source or sources (not shown) and exit diffusion tube 95 at opposite end B. The solid arrows in FIG. 8 indicate the direction of bulk gas flow in tube 95. Wafers $W_k$ where k=1, ..., N are held in wafer cassette 96, typically made of quartz, which rests in tube 95. Z plate $P_k$ where k=1, ..., N is attached to and extends upward from wafer cassette 96 between wafer $W_k$ and wafer $W_{K+1}$. Plate $P_N$ extends upward from wafer cassette 96 to the right of wafer $W_n$. The dotted line in FIG. 8 indicates the diffusion of gas between the wafers and the Z plates. Again, the exact configuration of the Z plate $P_k$ to produce a uniform depth profile over a surface of wafer $W_k$ and/or $W_{k+1}$ is determined experimentally using the principle that locally decreasing the distance between the wafer surface and the Z plate locally decreases the deposition rate on the wafer surface.

The above embodiments are meant to be exemplary and not limiting. In view of the above disclosure, other modifications will be obvious to one of average skill in the art without departing from the scope of the invention.

For example, while the system described above has two separate annular chambers for injecting two gases, in other embodiments of the invention, the injector system has a single annular chamber for injecting a single gas and in still other embodiments, the injector system has three separate annular chambers for injecting three gases. One or more of the gases may be inert. For example, polysilicon may be deposited using the embodiment shown in FIGS. 1-7 by using silane for gas A and nitrogen for gas B.

Further, while in the embodiments described above the exhaust vent is located surrounding the heater platform, it may also be located surrounding the circular Z plate. In the preferred embodiment (as shown) inner housing 38 forms the wall of a right circular cylinder, however housing 38 joining the circular base of the reactor chamber to the circular top of the reactor chamber may also be curved.

Finally, while a single cylindrical chamber is shown in FIG. 1, the system design may obviously be scaled up to contain a plurality of cylindrical chambers in one large rectangular housing that attaches to one large rectangular heater to allow a corresponding plurality of wafers to be processed simultaneously.

I claim:

1. A system for forming a film of substantially uniform thickness on a wafer without edge effects by chemical vapor deposition comprising:
    a cylindrical reactor chamber having a base and a top portion, wherein said base is inclined at a selected angle relative to the vertical;
    a circular wall connecting said base and said top portion;
    a heater platform forming a portion of said base and having a recess for supporting a semiconductor wafer so that said wafer is disposed substantially parallel to said base;
    means for introducing one or more gases into said reactor chamber;
    means for directing and deflecting said gases toward said circular wall so that said gases are uniformly mixed and are caused to flow radially inward of said reactor chamber;
    means for providing an exit for said gases; and
    a plate having a configured nonplanar surface in juxtaposition with said recess of said heater platform, said plate being configured to establish specified distances between each point of said nonplanar surface and opposing points on the surface of a wafer disposed in said heater platform recess, so that a predetermined thickness profile of a deposited film is produced on said wafer surface without deleterious edge effects.

2. A system as in claim 1 wherein said selected angle is about 3°-5° relative to the vertical.

3. A system for chemical vapor desposition of a film of uniform thickness on a surface of a substrate comprising:
    a cylindrical reactor chamber having a base;
    a heater platform having a central recessed well in which said substrate is positioned, the nominal thickness of said substrate being no greater than the depth of said well;
    an element having a nonplanar surface with a predetermined configuration, said nonplanar configured surface facing said recessed well, said element being contoured in those portions of its nonplanar surface opposite to the exposed surface of said substrate;
    a cylindrical wall joining said base and said element; and
    means for injecting one or more gases into said reactor chamber,
    whereby the thickness profile of said deposited film on the surface of said substrate is effectively controlled in accordance with the configured nonplanar element.

4. A system as in claim 1 including an exhaust vent surrounding said platform.

5. A system as in claim 1 including an annular exhaust vent located in said element.

6. A system as in claim 1 further including means for heating said substrate to a selected temperature.

7. A system as in claim 1 wherein said means for injecting comprises a first plurality of jets for injecting a first gas.

8. A system as in claim 7 wherein said first plurality of jets is distributed around a first annular region.

9. A system as in claim 7 further comprising means for deflecting said first gas toward said cylindrical wall of said reactor chamber.

10. A system as in claim 8 wherein said means for injecting further comprises a second plurality of jets for injecting a second gas.

11. A system as in claim 10 wherein said second plurality of jets is distributed around a second annular region.

12. A system as in claim 10 comprising means for deflecting said second gas toward said cylindrical wall of said reactor chamber.

13. A system as in claim 1 further including means for controlling the temperature of said element.

14. A system as in claim 1 wherein said surface opposite said base includes a right circular conical region.

15. A system as in claim 1 wherein said right circular conical region points toward said base.

16. A system as in claim 14 wherein said right circular conical region points away from said base.

17. A system as in claim 1 wherein said element includes an annular region for suppressing edge effects.

18. A system as in claim 1 wherein said base of said cylindrical reactor chamber is disposed at an angle other than 90° relative to vertical or to the direction of the earth's gravity vector.

* * * * *